US006370079B1

(12) United States Patent
Jung et al.

(10) Patent No.: US 6,370,079 B1
(45) Date of Patent: Apr. 9, 2002

(54) INTEGRATED CIRCUITS HAVING REDUCED TIMING SKEW AMONG SIGNALS TRANSMITTED THEREIN USING OPPOSINGLY ARRANGED SELECTION CIRCUITS

(75) Inventors: Joong-Keun Jung; Jae-Yuon Youn, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/313,855

(22) Filed: May 18, 1999

(30) Foreign Application Priority Data

Aug. 28, 1998 (KR) .............................................. 98-35220

(51) Int. Cl.$^7$ ................................................. G11C 8/12
(52) U.S. Cl. ............................ 365/230.06; 365/230.03; 365/51; 365/63
(58) Field of Search ........................ 365/230.03, 230.04, 365/230.06, 51, 63

(56) References Cited

U.S. PATENT DOCUMENTS

| 5,097,313 | A | | 3/1992 | Fujii .................... 365/189.01 |
| 5,784,322 | A | * | 7/1998 | Han et al. .................... 365/201 |
| 5,796,668 | A | * | 8/1998 | Seo et al. .................... 365/207 |
| 6,144,604 | A | * | 11/2000 | Haller et al. ................ 365/221 |

* cited by examiner

*Primary Examiner*—Andrew Q. Tran
(74) *Attorney, Agent, or Firm*—Myers Bigel Sibley & Sajovec

(57) ABSTRACT

Integrated circuits are disclosed wherein selection circuits are located at opposing ends of an undivided memory cell array. Locating the selection circuits at opposing ends of the memory cell array may reduce the difference in propagation time needed by different signals to travel to and from amplifiers in the integrated circuit. For example, if two signals are electrically connected to pins located on different parts of the integrated circuit, timing skew between the two signals may be reduced by locating the respective selection circuits so as to reduce the difference in respective distances traveled by the two signals.

16 Claims, 19 Drawing Sheets

| Fig. 3A | Fig. 3B | Fig. 3C |

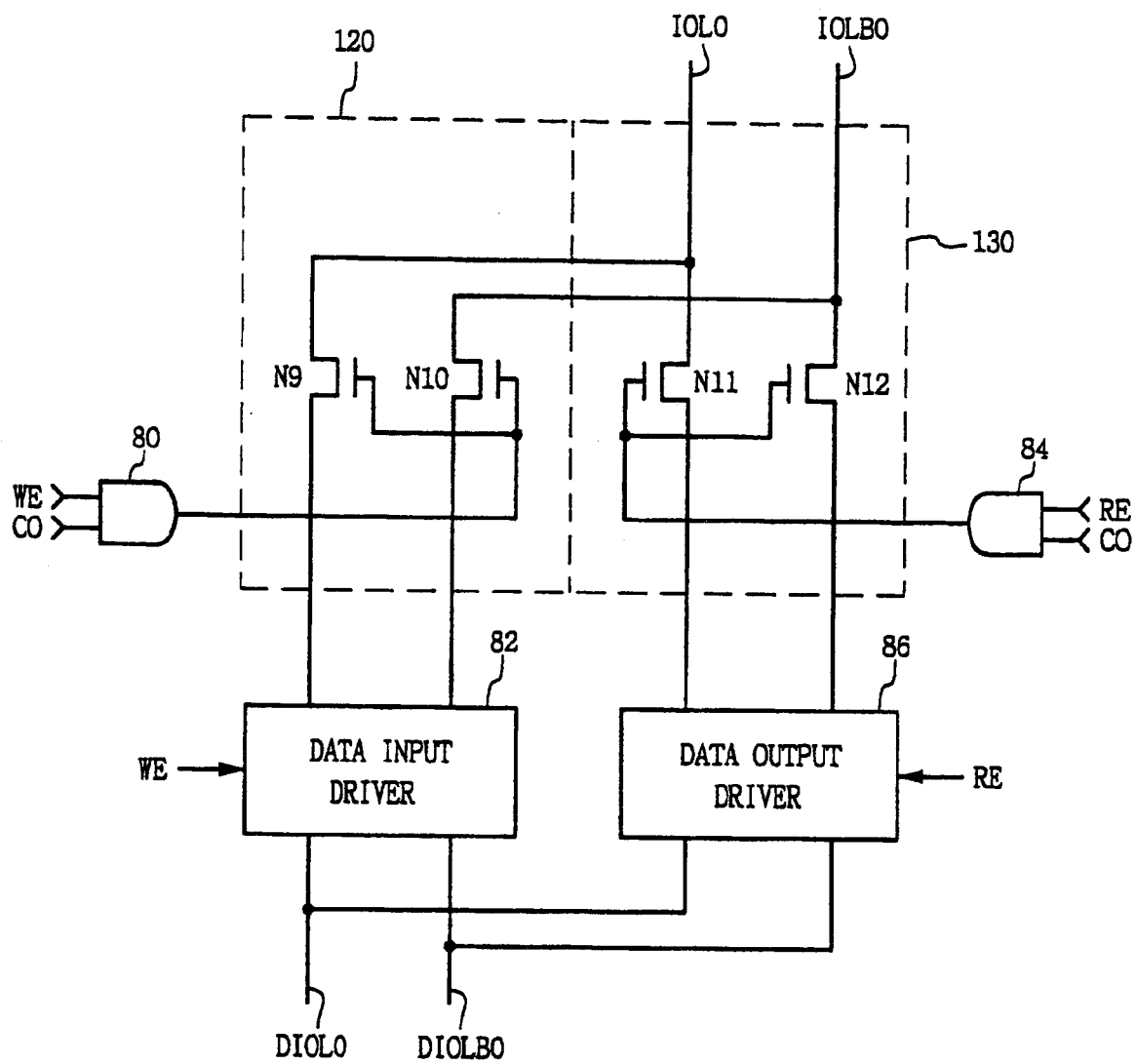

INTEGRATED CIRCUITS HAVING REDUCED TIMING SKEW AMONG SIGNALS TRANSMITTED THEREIN USING OPPOSINGLY ARRANGED SELECTION CIRCUITS

Field of the Invention

The present invention relates to the field of integrated circuits in general and more particularly to the arrangement of components in integrated circuits.

BACKGROUND OF THE INVENTION

Timing skew may be introduced between signals transmitted in an integrated circuit because some of the signals may propagate greater or lesser distances than others. For example, if two data signals in an integrated circuit memory propagate via different paths to output pads on the integrated circuit memory, the data signals may arrive at the data pads at different times. Unfortunately, as the layout of the integrated circuit occupies more area of a chip, the data signals may need to propagate greater distances. For example, as the capacity of an integrated circuit memory increases, more memory cell arrays may be included. Consequently, the difference in propagation times for data signals from different memory cell arrays may be increased as the number of memory cell arrays increases.

FIG. 1 is a block diagram that illustrates a conventional arrangement of an integrated circuit. Memory cell arrays 10-1 through 10-16 are organized in a left bank that includes the memory cell arrays 10-1 through 10-8 and a right bank that includes the memory cell arrays 10-9 through 10-16 which are separated by a column address decoder 16 located in a central region therebetween. Input/output line (IOL) pairs IOL0/B0 through IOL7/B7 are located between the memory cell arrays in the left bank and the input/output line pairs IOL8/B8 through IOL16/B16 are located between the memory cell arrays in the right bank. The IOL pair located between the respective memory cell arrays are shared by the adjacent memory cell arrays. For example, IOL pair IOL2/B2 and IOL3/B3 located between the memory cell arrays 10-1, 10-2 are shared to provided data to and from memory cell arrays 10-1, 10-2.

Data line pairs DIOL0/B0 through DIOL3/B3 are horizontally arranged above the left bank of memory cell arrays 10-1 through 10-8. Data line pairs DIOL4/B4 through DIOL7/B7 are horizontally arranged above DIOL0/B0 through DIOL3/B3. Data input/output line pairs DIOL8/B8 through DIOL11/B11 are horizontally arranged above the right bank of memory cell arrays 10-9 through 10-16. Data line pairs DIOL12/B12 through DIOL15/B15 are horizontally arranged above the data input/output line pairs DIOL8/B8 through DIOL11/B11.

Data input/output selection circuits 12-1 through 12-9 are horizontally arranged between the memory cell arrays 10-1 through 10-8 and the data input/output line pairs DIOL0/B0 through DIOL3/B3. Data input/output selection circuits 12-10 through 12-18 are arranged between the memory cell arrays 10-9 through 10-18 and the data input/output line pairs DIOL8/B8 through DIOL11/B11. Input/output sense amplifiers 14-1, 14-3 are respectively connected to the data input/output line pairs DIOL0/B0 through DIOL3/B3 and data input/output line pairs DIOL8/B8 through DIOL11/B11. Input/output sense amplifiers 14-2, 14-4 are located above the column address decoder 16 and are respectively connected to data input/output line pairs DIOL4/B4 through DIOL7/B7 and DIOL12/B12 through DIOL15/B15.

Data input/output pads DQ0, DQ1, DQ2, DQ3, DQ8, DQ9, DQ10, D11 are horizontally and linearly arranged on the right top side of the memory, and data input/output pads DQ4, DQ5, DQ6, DQ7, DQ12, DQ13, DQ14, DQ15 are horizontally and linearly arranged on the right bottom side of the memory as shown in FIG. 1.

During a write operation, the memory cell arrays 10-1 through 10-16 transfer data from the input/output line pairs to bit line pairs (not shown) in response to block control signals C0, C1, C2 and C3. During a read operation, the memory cell arrays 10-1 through 10-16 transfer data from the bit line pairs to the input/output line pairs. Generally, the block control signals C0 through C3 may be generated by using a row address signal. The column address decoder 16 decodes a column address to generate column address selection signals Y0 through Yn. The data input/output selection circuits control transmission of data between the data input/output line pairs and the input/output line pairs. For example, the data input/output selection circuits 12-1, 12-2 transmit data from the data input/output line pairs DIOL0/B0, DIOL1/B1, DIOL2/B2, DIOL3/B3 to the input/output line pairs IOL0/B0, IOL1/B1, IOL2/B2, IOL3/B3 during a write operation. The data input/output selection circuits 12-1, 12-2 transmit data from the input/output line pairs IOL0/B0, IOL1/B1, IOL2/B2, IOL3/B3 to the data input/output line pairs DIOL0/B0, DIOL1/B1, DIOL2/B2 and DIOL3/B3 during a read operation.

Signals that enable the data input/output selection circuits 12-1 through 12-18 are generated so that the pair of input/output selection circuits adjacent to the selected memory cell arrays are enabled. For example, the data input/output selection circuits 12-5, 12-14 are respectively positioned between the memory cell arrays 10-4, 10-5 and the data input/output line pairs DIOL0/B0 through DIOL3/B3, and between the memory cell arrays 10-12, 10-13 and the data input/output line pairs DIOL8/B8 through DIOL11/B11, thereby enabling the input/output line pairs IOL0/B0, IOL1/B1 to be connected to the respective data input/output line pairs DIOL0/B0, DIOL1/B1 when the memory cell array block 10-4 is selected, and enabling the input/output line pairs IOL4/B4, IOL5/B5 to be connected to the data input/output line pairs DIOL4/B4, DIOL5/B5, respectively.

The input/output sense amplifier 14-1 amplifies data from the data input/output line pairs DIOL0/B0 through DIOL3/B3 and outputs the data onto the data input/output pads DQ0, DQ1, DQ2 and DQ3, or amplifies data input from the data input/output pads DQ0, DQ1, DQ2 and DQ3 and transmits the data to the data input/output line pairs DIOL0/B0 through DIOL3/B3. Data input/output buffers (not shown) are connected between the input/output sense amplifiers and the data input/output pads. The other input/output sense amplifiers 14-2, 14-3, 14-4 perform in a fashion analogous to the operation of the input/output sense amplifier 14-1 described above.

During a read operation, the column address decoder 16 decodes the column address to generate the column selection signals Y1 through Yn. When the block control signal C0 is enabled and the memory cell arrays 10-1, 10-5, 10-12 and 10-16 are selected, data output from the memory cells selected by word line of the memory cell array 10-1 and column selection signals are transmitted to the input/output line pairs IOL0/B0 through IOL3/B3. The data input/output selection circuits 12-1, 12-2 transmit data from the input/output line pairs IOL0/B0 through IOL3/B3 to the data input/output line pairs DIOL0/B0 through DIOL3/B3, respectively. Data output from the memory cells selected by column selection signals and word line of the memory cell array 10-4 are transmitted onto the input/output line pairs IOL4/B4 through IOL7/B7 positioned on the left and right sides of the memory cell array 10-5. The data input/output selection circuits 12-5, 12-6 transmit data from the input/output line pairs IOL4/B4 through IOL7/B7 to the data input/output line pairs DIOL4/B4 through DIOL7/B7, respectively.

The memory cell arrays 10-12, 10-16 and data input/output selection circuits 12-14, 12-18 also transmit the data from the corresponding memory cells to the data input/output line pairs DIO8/B8 through DIO15/B15, respectively. The input/output sense amplifiers 14-1, 14-2, 14-3 and 14-4 transmit data from the data input/output line pairs DIO0/B0 through DIO15/B15 to the data input/output pads DQ0 through DQ15. As will be understood by those of ordinary skill in the art, a write operation is performed in a reverse order relative to the above-described read operation.

As shown in FIG. 2, divided memory cell arrays 18-1 through 18-32 are divided into upper and lower left and right banks relative to the column address decoders 16-1, 16-2. In contrast to the memory cell arrays of FIG. 1, the divided memory cell arrays are separated into two smaller memory cell arrays which may be accessed via two sets of column address signals YA0–YA(n/2) and YB0–YB(n/2).

The column address decoders 16-1, 16-2 are arranged in a central region between the left and right banks of the memory cell arrays. The input/output line pairs IOL/B are arranged in pairs on both banks of each of memory cell arrays. The input/output pairs positioned between the memory cell array blocks are shared. For example, the input/output line pairs IOL2/B2, IOL3/B3 positioned between the upper memory cell block 18-1 and upper memory cell array block 18-3 are shared with the input/output line pairs IOL6/B6, IOL7/B7 positioned between the lower memory cell array block 18-1 and lower memory cell array block 18-4.

Data input/output line pairs DIOL0/B0 through DIOL3/B3 are horizontally arranged above the upper memory cell arrays. Data input/output line pairs DIOL4/B4 through DIOL7/B7 are horizontally arranged below the lower memory cell arrays. Likewise, data input/output line pairs DIOL8/B8 through DIOL11/B11 are horizontally arranged above the upper memory cell arrays 18-17, 18-19, 18-21, 18-23, 18-25, 18-27, 18-29, 18-31. Data input/output line pairs DIOL12/B12 through DIOL15/B15 are horizontally arranged below the lower memory cell arrays 18-18, 18-20, 18-22, 18-24, 18-26, 18-28, 18-30. Data input/output selection circuits 12-1 through 12-9 are arranged between the memory cell arrays 18-1, 18-3, 18-5, 18-7, 18-9, 18-11, 18-13, 18-15 and the data input/output line pairs DIOL0/B0 through DIOL3/B3.

Data input/output selection circuits 12-10 through 12-18 are arranged between the memory cell arrays 18-17, 18-19, 18-21, 18-23, 18-25, 18-27, 18-29, 18-31 and data input/output line pairs DIOL8/B8 through DIOL11/B11. Data input/output selection circuits 12-19 through 12-27 are arranged between the lower memory cell arrays 18-2, 18-4, 18-6, 18-8, 18-10, 18-12, 18-14, 18-16 and data input/output line pairs DIOL4/B4 through DIOL7/B7. Data input/output selection circuits 12-28 through 12-36 are arranged between the lower memory cell arrays 18-18, 18-20, 18-22, 18-24, 18-26, 18-28, 18-30, 18-32 and data input/output line pairs DIOL12/B12 through DIOL15/B15. Input/output sense amplifiers 14-1, 14-2 are respectively connected to data input/output line pairs DIOL0/B0 through DIOL3/B3 and DIOL8/B8 through DIOL1/B11.

Input/output sense amplifiers 14-2, 14-3 are respectively connected to data input/output line pairs DIOL4/B4 through DIOL7/B7 and DIOL12/B12 through DIOL15/B15. The first data input/output pads DQ0, DQ1, DQ2, DQ3, DQ8, DQ9, DQ10, DQ11 are linearly arranged above the data input/output line pairs DIOL8/B8 through DIOL11/B11 and the second input/output pads DQ4, DQ5, DQ6, DQ7, DQ12, DQ13, DQ14, DQ15 are linearly arranged below the data input/output line pairs DIOL12/B12 through DIOL15/B15. That is to say, the arrangement of the memory shown in FIG. 2 has a symmetrical upper and lower arrangement.

The column address decoders 16-1, 16-2 are operated simultaneously and the memory cell arrays are accordingly enabled. For example, when the block control signal C0 is enabled and the memory cell arrays 18-1, 18-2, 18-9, 18-10, 18-23, 18-24, 18-31, 18-32 are selected, data is transmitted to the associated data input/output line pairs via the data input/output selection circuits 12-1, 12-2, 12-19, 12-20, 12-5, 12-6, 12-23, 12-24 and the data input/output selection circuits 12-13, 12-14, 12-31, 12-32, 12-17, 12-18, 12-35, 12-36.

To avoid conflict in the operation of the data input/output selection circuits, only a pair of data input/output selection circuits connected to the respective data input/output lines operate simultaneously. For example, the data input/output selection circuits 12-1, 12-2 and 12-23, 12-24 and the data input/output selection circuits 12-17, 12-18 and 12-31, 12-32 may be operated simultaneously. Alternately, the data input/output selection circuits 12-19, 12-20 and 12-5, 12-6 and the data input/output selection circuits 12-35, 12-36 and 12-13, 12-14 may be operated simultaneously. One column address bit may be used to generate a signal that controls which data input/output selection circuits are operated.

According to the arrangement of the integrated circuit memory shown in FIG. 2, since the data input/output selection circuits, data input/output line pairs and input/output sense amplifiers have a symmetrically upper and lower arrangement, the data line loading and timing skew may be reduced. However, since the number of data input/output selection circuits is increased as compared to the embodiment of FIG. 1, the total area occupied by the integrated circuit may be increased.

As the capacity of integrated circuit memories increases, the number of memory cell arrays and the number of the surrounding circuits for controlling the memory cell arrays may also increase. It is possible to reduce the area occupied by the memory cell array when the capacity of the semiconductor memory device is increased, however the area occupied by the surrounding circuits may not be equally reduced. Consequently, there is a need to allow an increase in the area occupied by an integrated circuit while controlling the amount of timing skew introduced between signals transmitted in the integrated circuit.

SUMMARY OF THE INVENTION

It is, therefore, an object of the present invention to allow an improvement in the operation of integrated circuits.

It is a further object of the present invention to allow reductions in timing skew between signals transmitted in an integrated circuit.

It is another object of the present invention to allow reductions in the overall size of an integrated circuit while providing for reductions in timing skew between signals transmitted in an integrated circuit.

These and other objects of the present invention are provided by an integrated circuit having selection circuits located at opposing ends of undivided memory cell arrays. Locating the selection circuits at opposing ends of the undivided memory cell arrays may reduce the difference in propagation time needed by different signals to travel to and from amplifiers in the integrated circuit. For example, if two signals are electrically connected to pins located on different parts of the integrated circuit, timing skew between the two signals may be reduced by locating the respective selection circuits so as to reduce the difference in respective distances traveled by the two signals.

In one aspect of the present invention, selection circuits are located alternatingly at the opposing ends of the undivided memory cell arrays. Accordingly, the difference in propagation time needed by different signals to travel to and from the respective amplifier may be reduced. Moreover, by alternating which end of the undivided memory cell the selections circuit is located, the number of selection circuits may be reduced which may allow the overall size of the integrated circuit to be reduced. For example, selection circuits which are adjacent to each other at one end of the undivided memory cell arrays may provide data to and from non-adjacent undivided memory cell arrays.

In a further aspect of the present invention, conductive lines conduct data the selection circuits to and from the undivided memory cell arrays. The conductive lines extend between adjacent undivided memory cells for at least the entire length of the undivided memory cell arrays.

In a further aspect of the present invention, the conductive lines are formed in pairs. Each selection circuit is electrically connected to a single one of the conductive line pairs. The size of each selection circuit may thereby be reduced which may allow the overall size of the integrated circuit to be reduced.

BRIEF DESCRIPTION OF THE DRAWINGS

FIG. 7 is a schematic diagram of the data input/output selection circuit of FIG. 6.

DETAILED DESCRIPTION OF THE PREFERRED EMBODIMENTS OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3A:
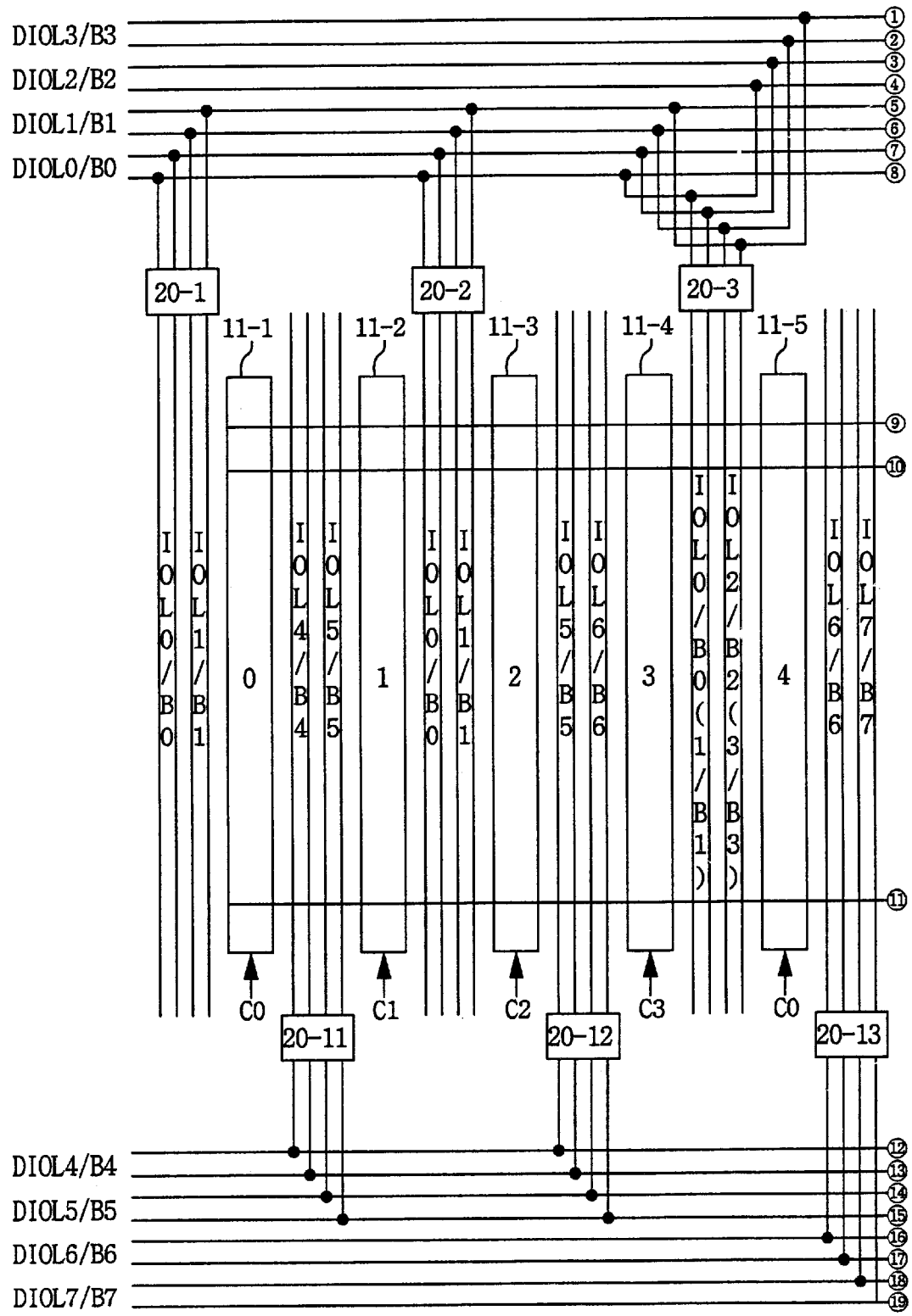
FIG. 3 is a block diagram that illustrates an arrangement of components of an integrated circuit memory according to a first embodiment of the present invention.
Figure 3B:
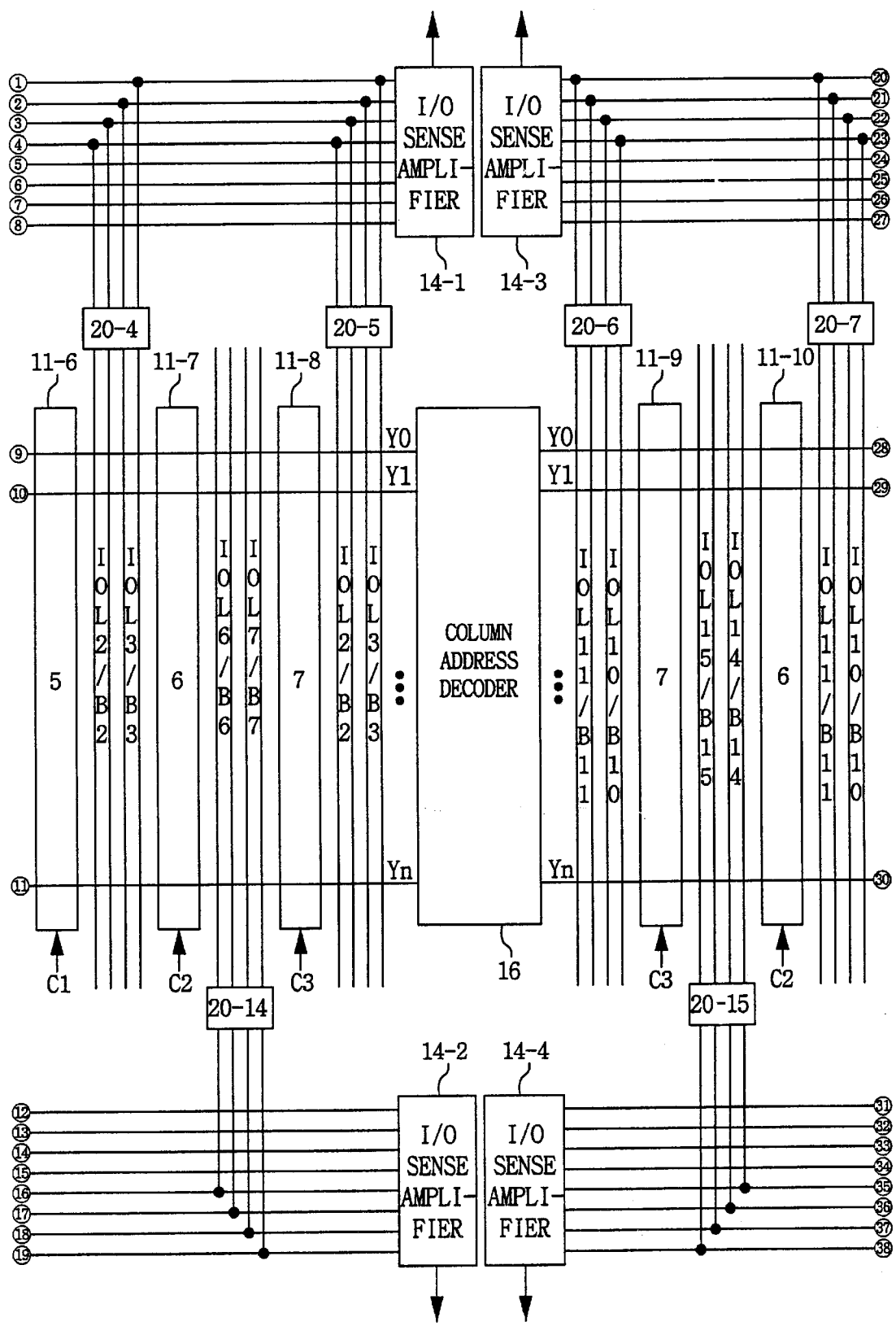
Figure 3C:
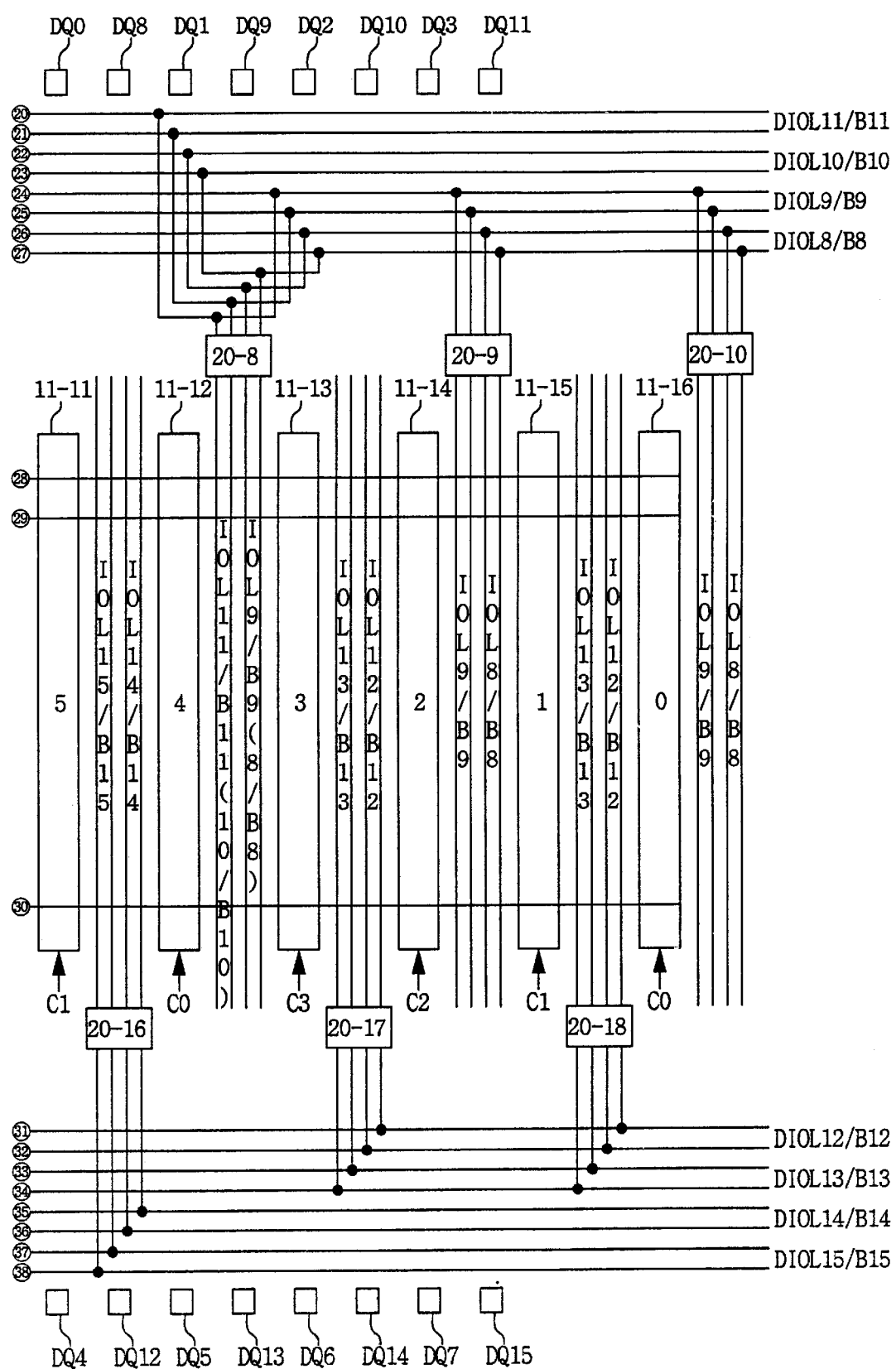

FIG. 3 is a block diagram that illustrates an arrangement of components in an integrated circuit memory according to a first embodiment of the present invention. According to FIG. 3, undivided memory cell arrays 11-1 through 11-16 store/retrieve data provided to and from the undivided memory cell arrays 11-1 through 11-16 from and to data selection circuits 20-1 through 20-18 via input/output lines IOL0/B0 through IOL15/B15. The data selection circuits 20-1 through 20-18 are located near first and second opposing ends of the memory cell arrays 11-1 through 11-16.

The data selection circuits 20-1 through 20-18 are located near either the first or second end of the respective undivided memory cell array based on the data bits provided to data input/output pins DQ0 through DQ15 by the particular data selection circuit. For example, input/output pads DQ4 through DQ7 and DQ12 through DQ15 are located in the lower right hand corner of FIG. 3. Consequently, the data selection circuits 20-11 through 20-18 are located near the second ends of the undivided memory cell arrays 11-1 through 11-16 which is closer to input/output pads DQ4 through DQ7 and DQ12 through DQ15. Similarly, data selection circuits 20-1 through 20-10 are located near the first ends of the undivided memory cell arrays because data input/output pads DQ0 through DQ3 and DQ8 through DQ11 are located in the upper right hand corner of FIG. 3.

In a preferred embodiment, the data selection circuits 20-1 through 20-18 are located at the first and second ends of the undivided memory cell arrays 11-1 though 11-16 in an alternating pattern as shown in FIG. 3. In other words, data selection circuits are not located near both the first and second ends of each of the undivided memory cell arrays 11-1 through 11-16. For example, the data selection circuit 20-1 is located at the first end of the undivided memory cell array 11-1 which transmits/receives data bits 0 and 1 to and from the undivided memory cell array 11-1 via IOL0/B0 and IOL1/B1. The data selection circuit 20-11 is located at the second end of the undivided memory cell array 11-1 which transmits/receives data bits 4 and 5 to and from the undivided memory cell array 11-1 via IOL4/B4 and IOL5/B5.

Figure 1A:
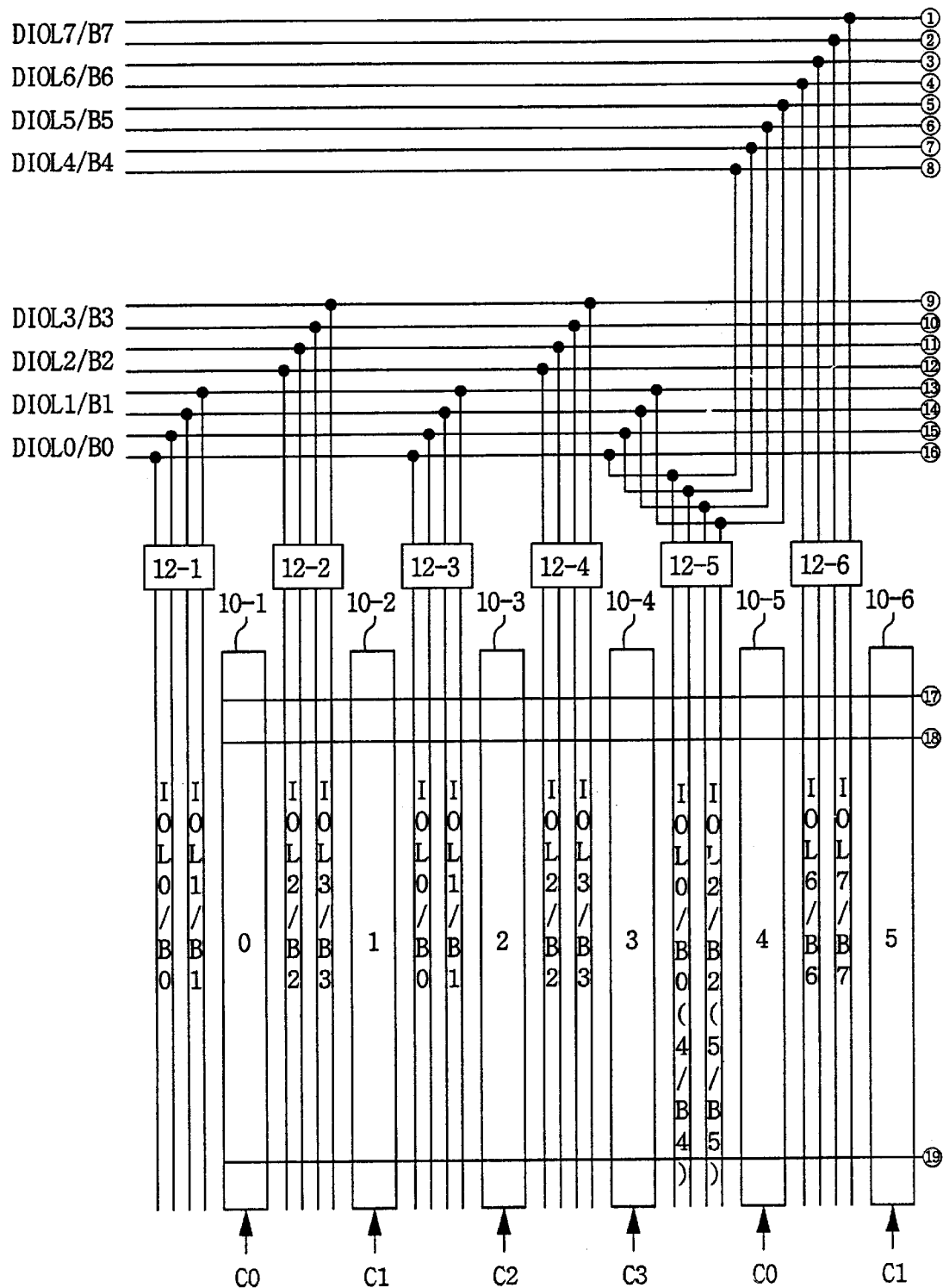
FIG. 1 is a block diagram that illustrates a first embodiment of a conventional arrangement of components of an integrated circuit memory.
Figure 1B:
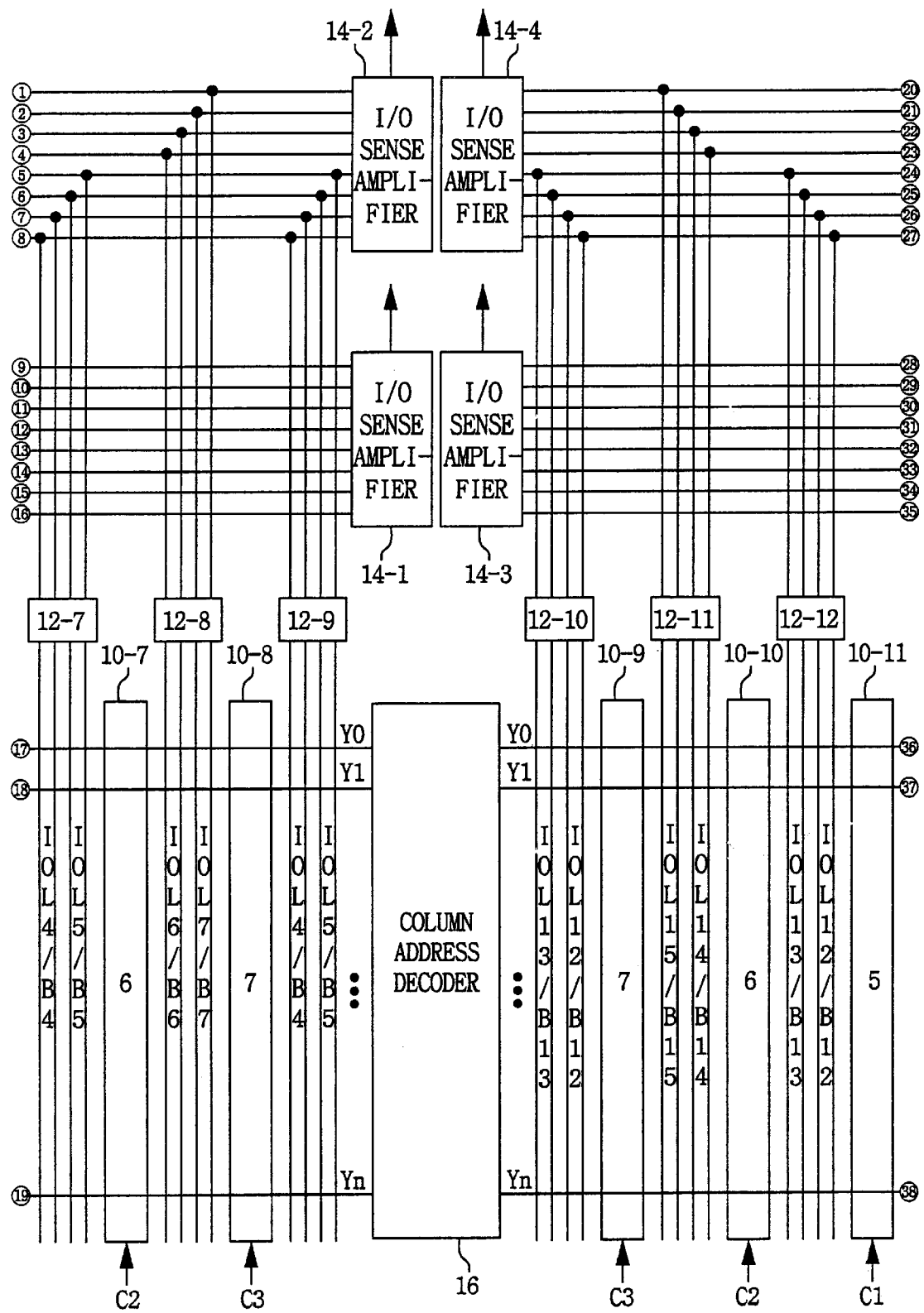
Figure 1C:
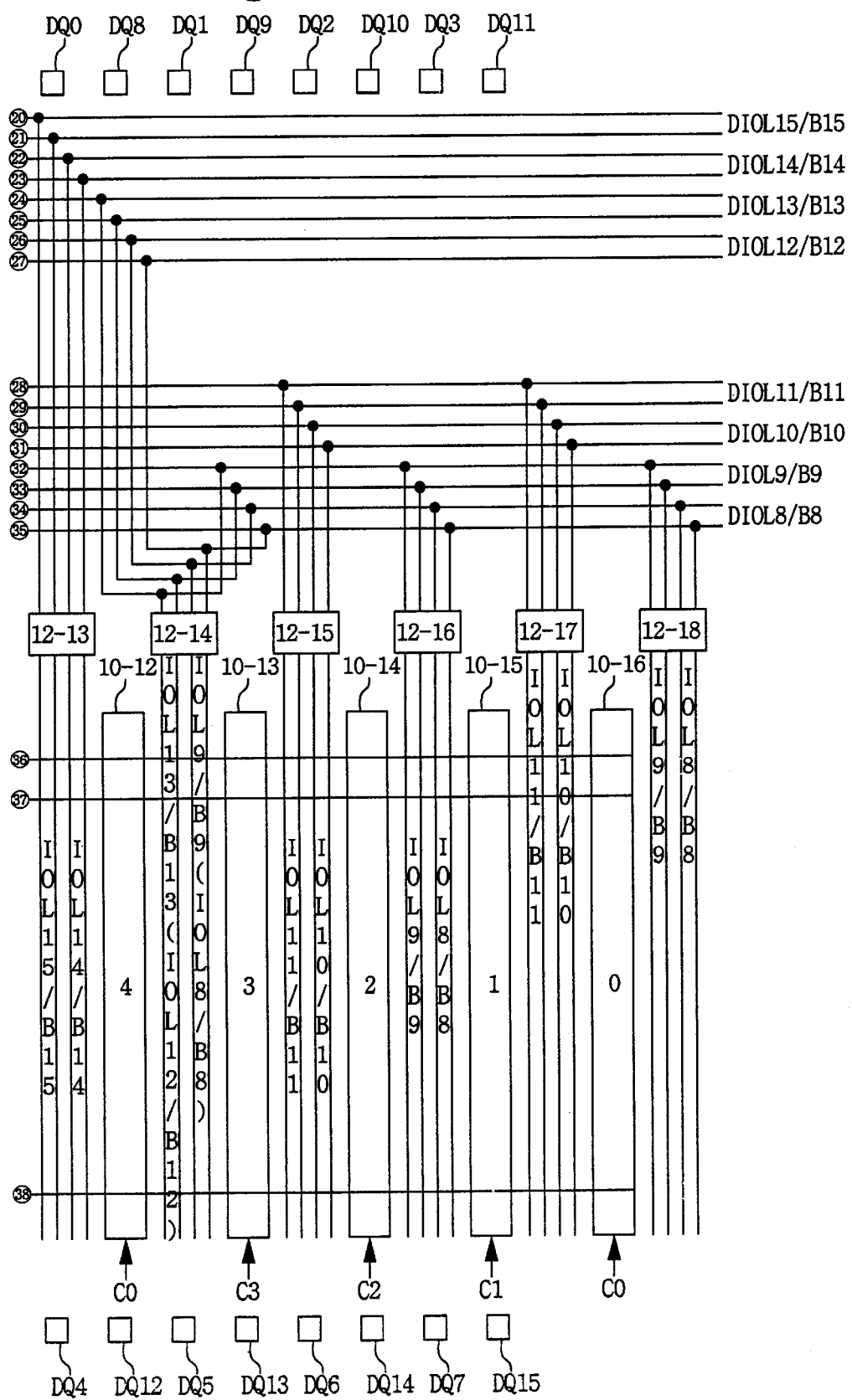
Figure 2:
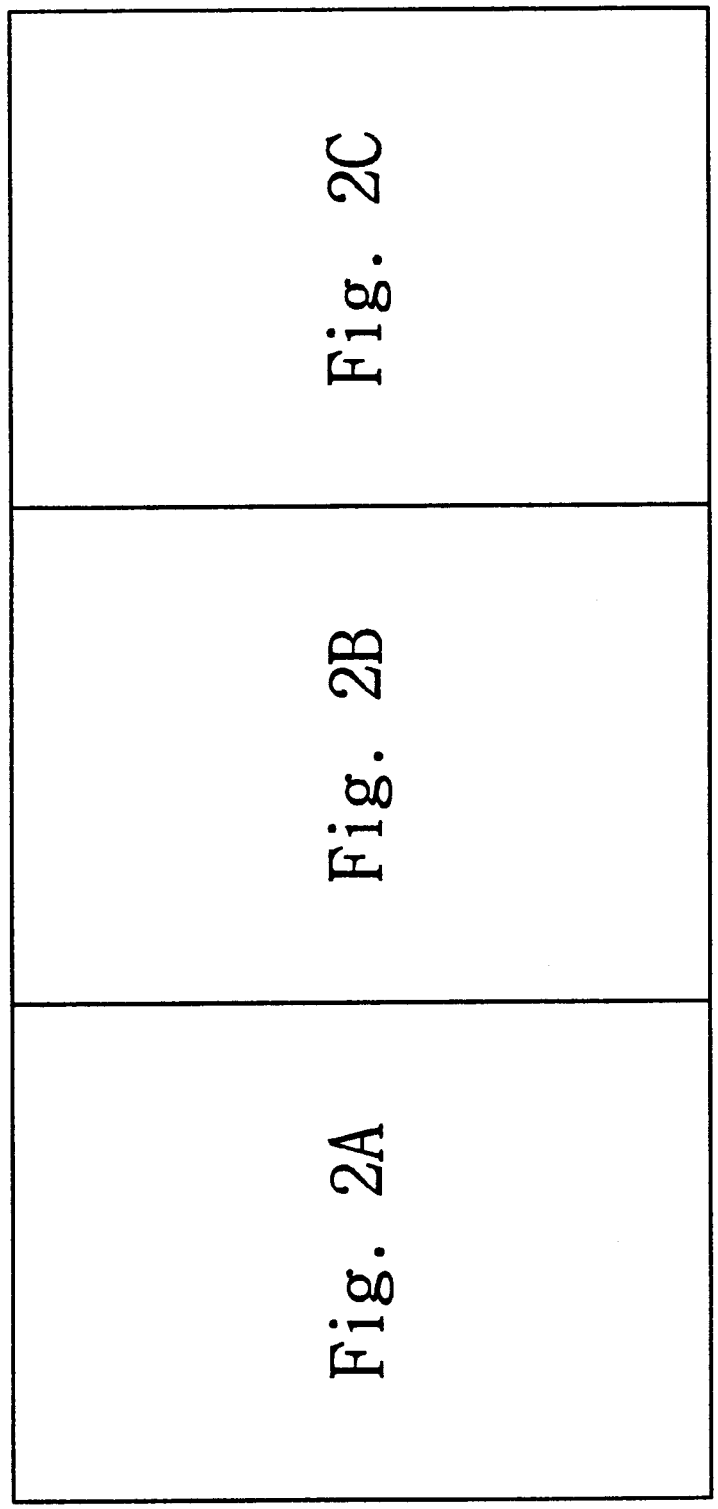
FIG. 2 is a block diagram that illustrates a second embodiment of a conventional arrangement of components of an integrated circuit memory.
Figure 2A:
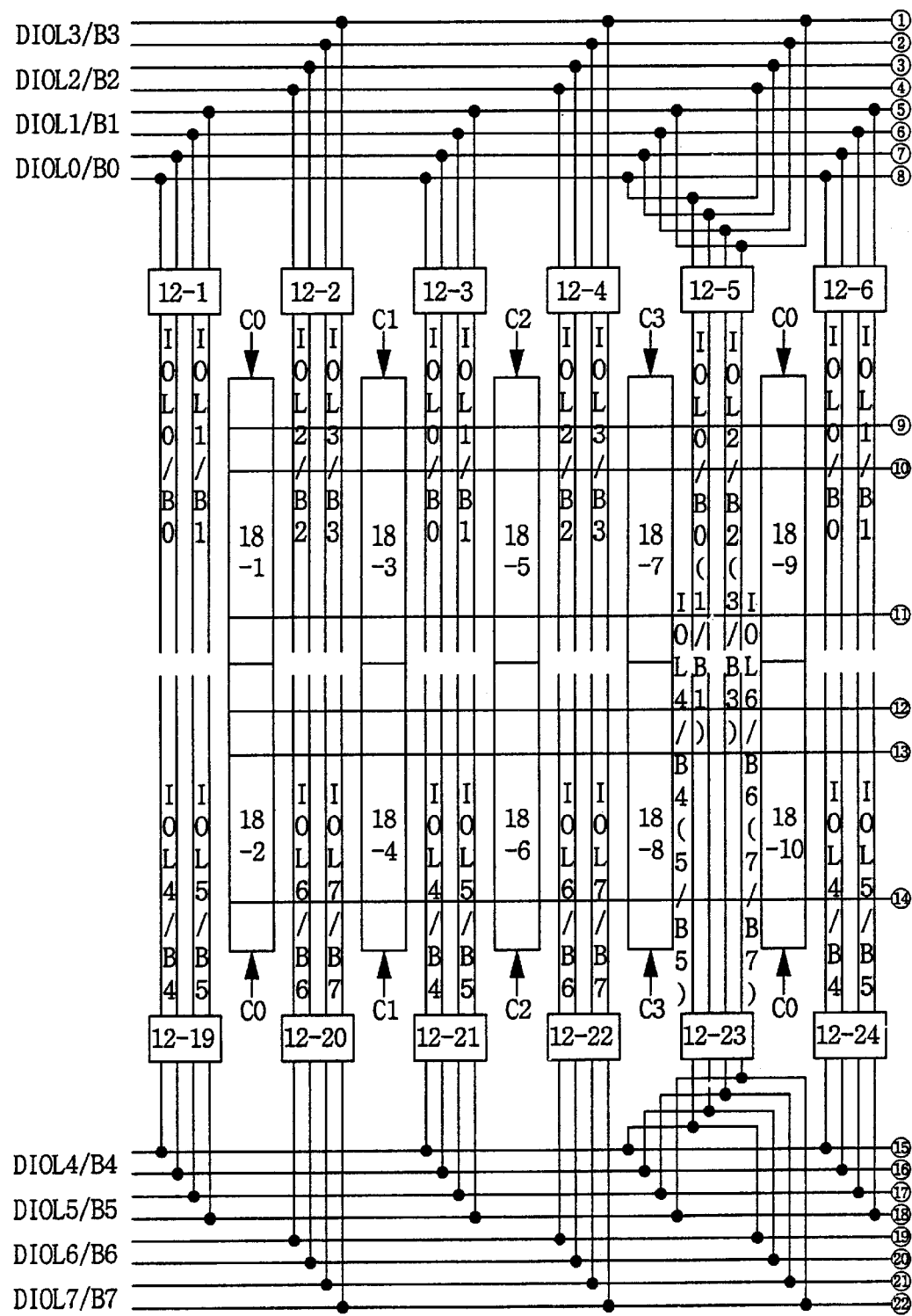
Figure 2B:
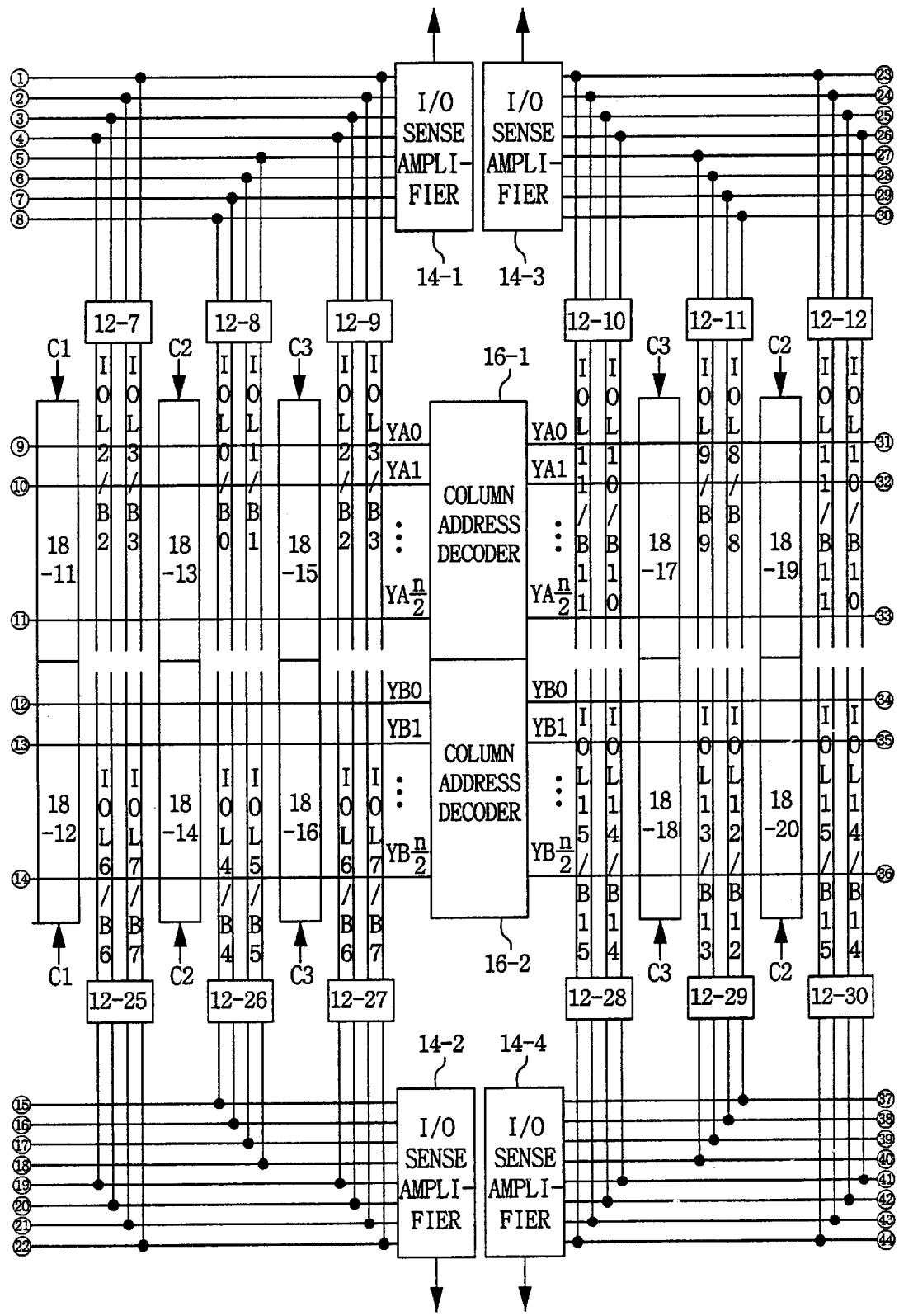
Figure 2C:
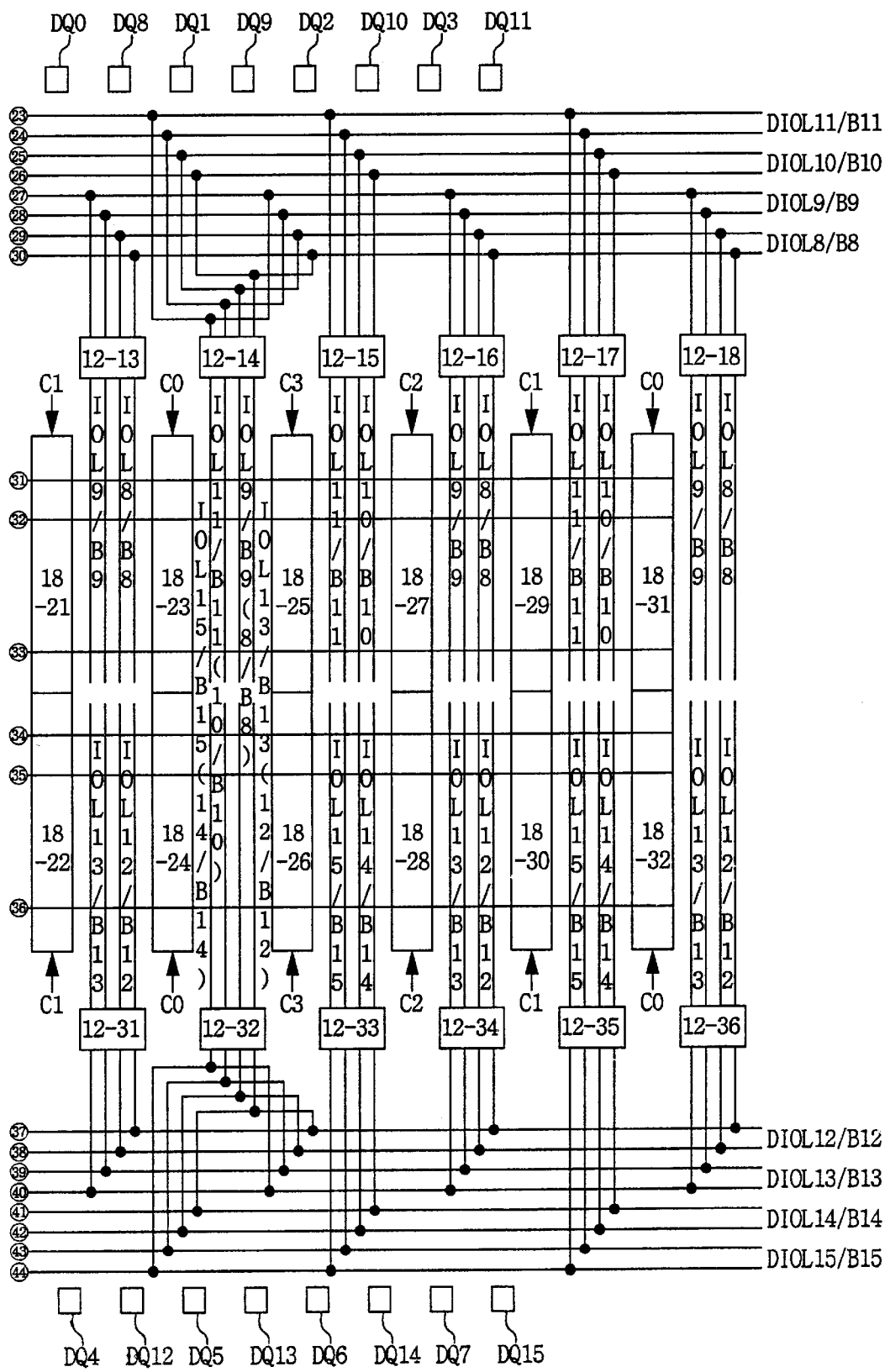

Locating the data selection circuits 20-1 through 20-18 near the first or second opposing ends of the undivided memory cell arrays 11-1 through 11-16 may provide a reduction in timing skew between data signals transmitted in the integrated circuit memory. Moreover, alternating the location of the data selection circuit between the first and then the second ends of the undivided memory cell arrays 11-1 through 11-16 may reduce the number of data selection circuits. In a preferred embodiment, the present invention reduces the number of data selection circuits to one half of that used in the conventional memory of FIG. 2.

Referring again to FIG. 3, input/output lines IOL0/B0 through IOL15/B15 extend from the first end to the second end and between the undivided memory cell arrays 11-1 through 11-16. Data input/output lines DIOL0/B0 through DIOL15/B15 provide the data to and from the data selection circuits 20-1 through 20-16 from and to I/O sense amplifiers 14-1 through 14-4. For example, DIOL0/B0 through DIOL3/B3 provide data bits 0-3 to and from the data selection circuits 20-1 through 20-5 from and to I/O sense amplifier 14-1 during write and read operations respectively. Data bits 0-3 are provided to and from the I/O senses amplifier 14-1 from and to DQ0 through DQ3 located in the upper right hand corner of FIG. 3.

Figure 4:
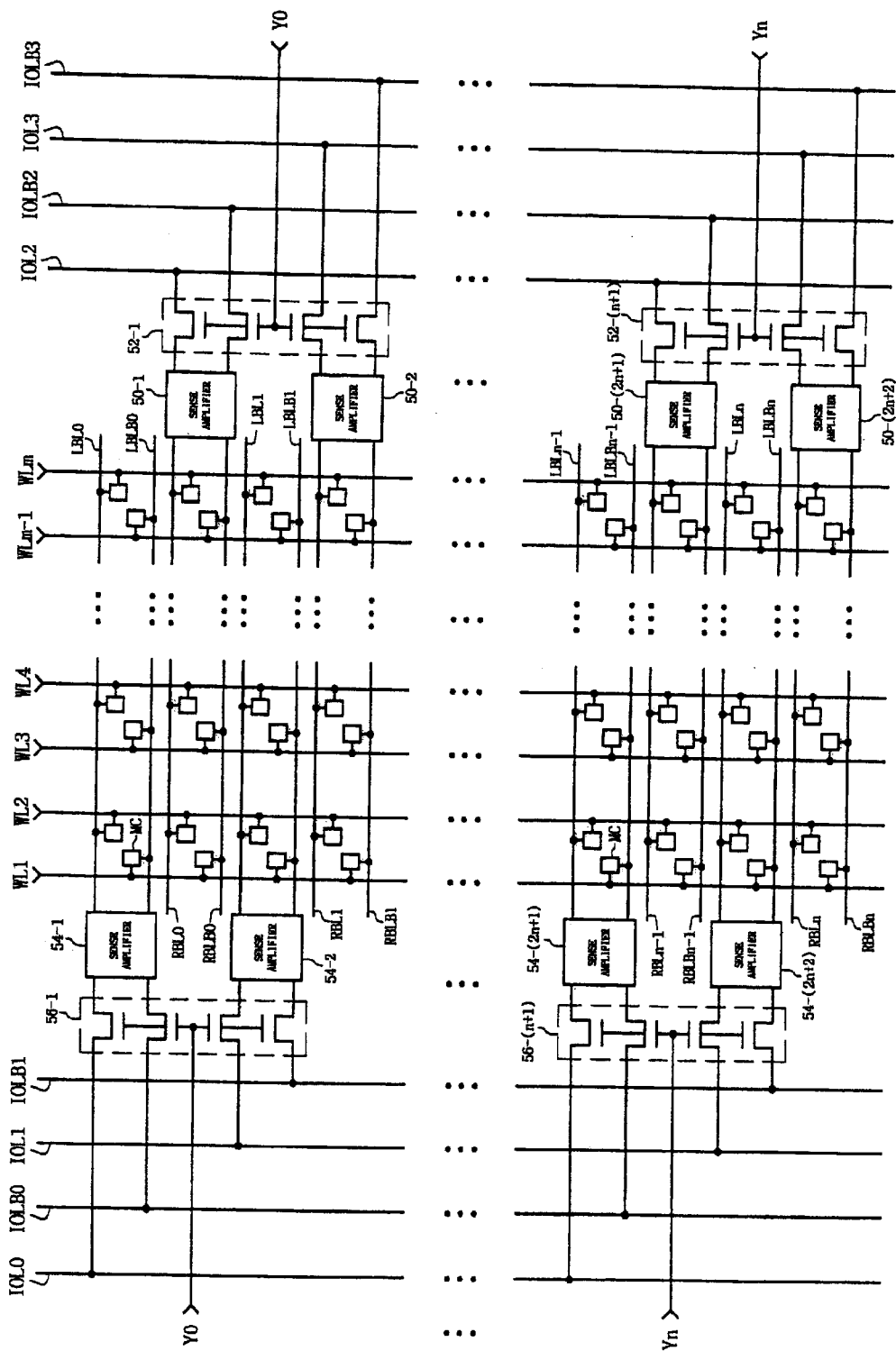
FIG. 4 is a block diagram of the memory cell array of FIG. 3.

FIG. 4 is a block diagram of the memory cell array 11-1 of FIG. 3. According to FIG.4, the input/output line pairs IOL0/B0, IOL1/B1, IOL4/B4, IOL5/B5 are arranged on the left and right sides of the memory cell array 11-1 respectively. The memory cell array 11-1 includes left bit line pairs LBL0/B0 through LBLn/Bn and right bit line pairs RBL0/B0 through RBLn/Bn which connect the respective input/output line pairs to associated memory cells MC through sense amplifiers 54-1 through 54-(2n+2) and 50-1 through 50-(2n+2) respectively. Data is provided to and from the sense amplifiers from and to the input/output lines pairs via left and right column selection switches 56-1 through 56-(n+1) and 52-1 through 52-(n+1) controlled by the appropriate column selection signal.

In a read operation, the block control signal C0 is generated in response to 2 row address bits (which select the memory cell array block 11-1) which controls a word line WL0 and the column selection signal Y0 whereupon data is read from the memory cells connected to the word line WL0. Column selection switches 52-1, 56-1 are turned-on in response to the column selection signal Y0 and data is enabled on the bit line pairs LBL0/B0, RBL0/B0, LBL1/B1, RBL1/B1 and transmitted to the input/output line pairs IOL0/B0, IOL1/B1, respectively. It will be understood by those having skill in the art that data is output onto input/output line pairs IOL4/B5, IOL5/B5 in an analogous fashion.

Figure 5:
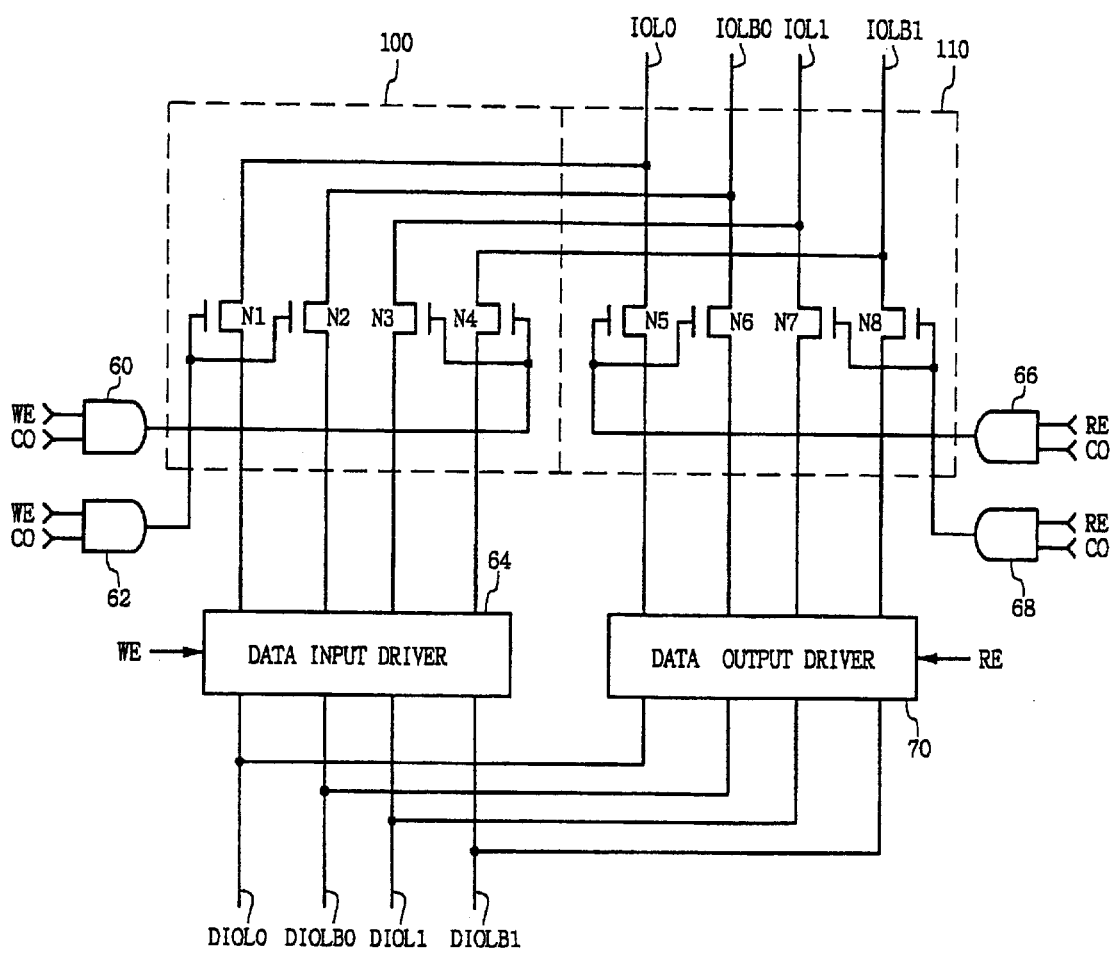
FIG. 5 is a schematic diagram that illustrates the data input/output selection circuit shown in FIG. 3.

FIG. 5 is a schematic diagram that illustrates the data input/output selection circuit 20-1 of FIG. 3. According to FIG. 5, the data input/output selection circuit 20-1 includes a write data switch 100 which includes NMOS transistors N1, N2, N3, N4 which couple the data input/output line pairs DIOL0/B0, DIOL1/B1 to a data input driver 64 when the undivided memory cell array 11-1 is selected by the block control signal C0 during a write operation (WE) via NAND gates 60, 62. The data input driver transmits the coupled data to the input/output line pairs IOL0/B0, IOL1/B1.

During a read operation, a data output driver 70 transmits the data from the input/output line pairs IOL0/B0, IOL1/B1 to the data input/output line pairs DIOL0/B0, DIOL1/B1 via a read data switch 110 that includes NMOS transistors N5, N6, N7, N8 controlled by the block control signal C0 during the read operation (RE) via NAND gates 66, 68.

Figure 6:
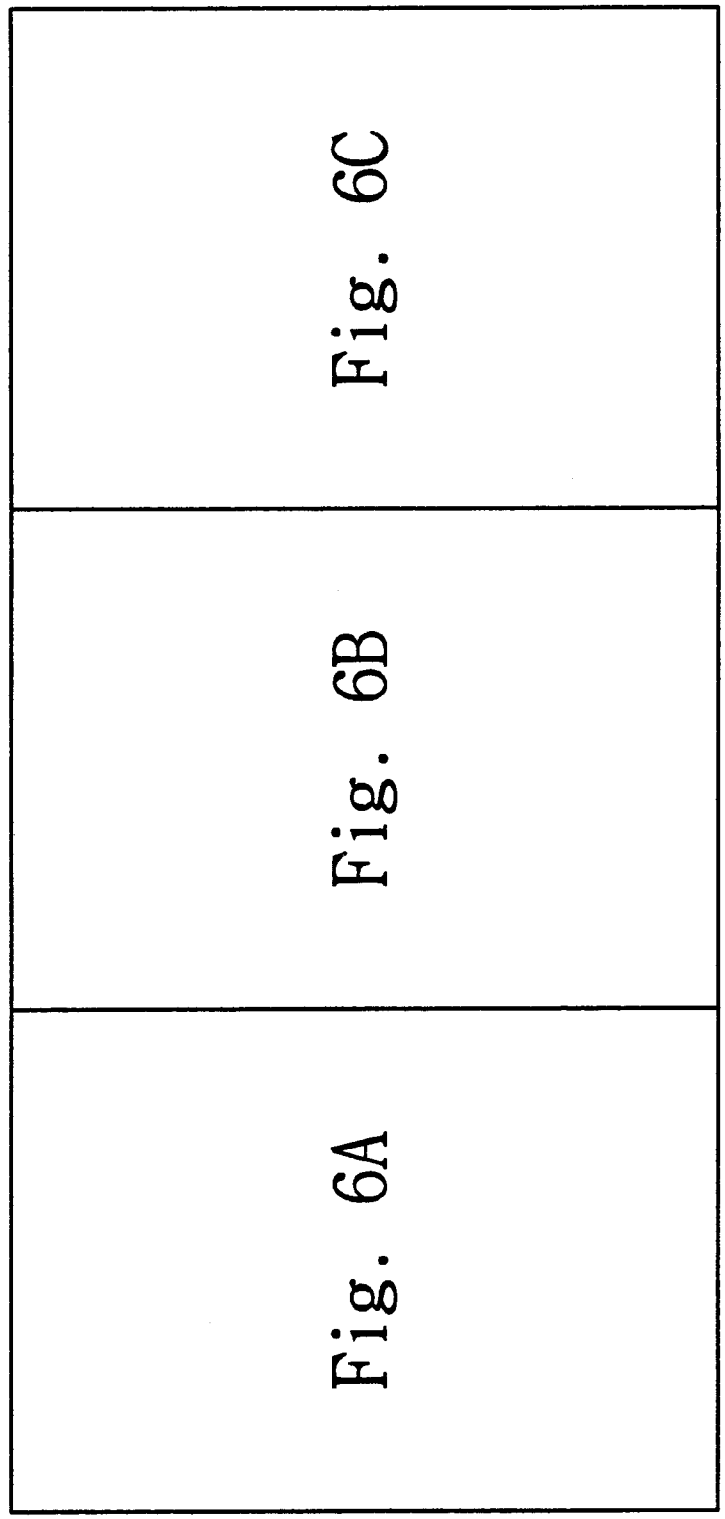
FIG. 6 is a block diagram that illustrates an arrangement of components of an integrated circuit memory according to a second embodiment of the present invention.
Figure 6A:
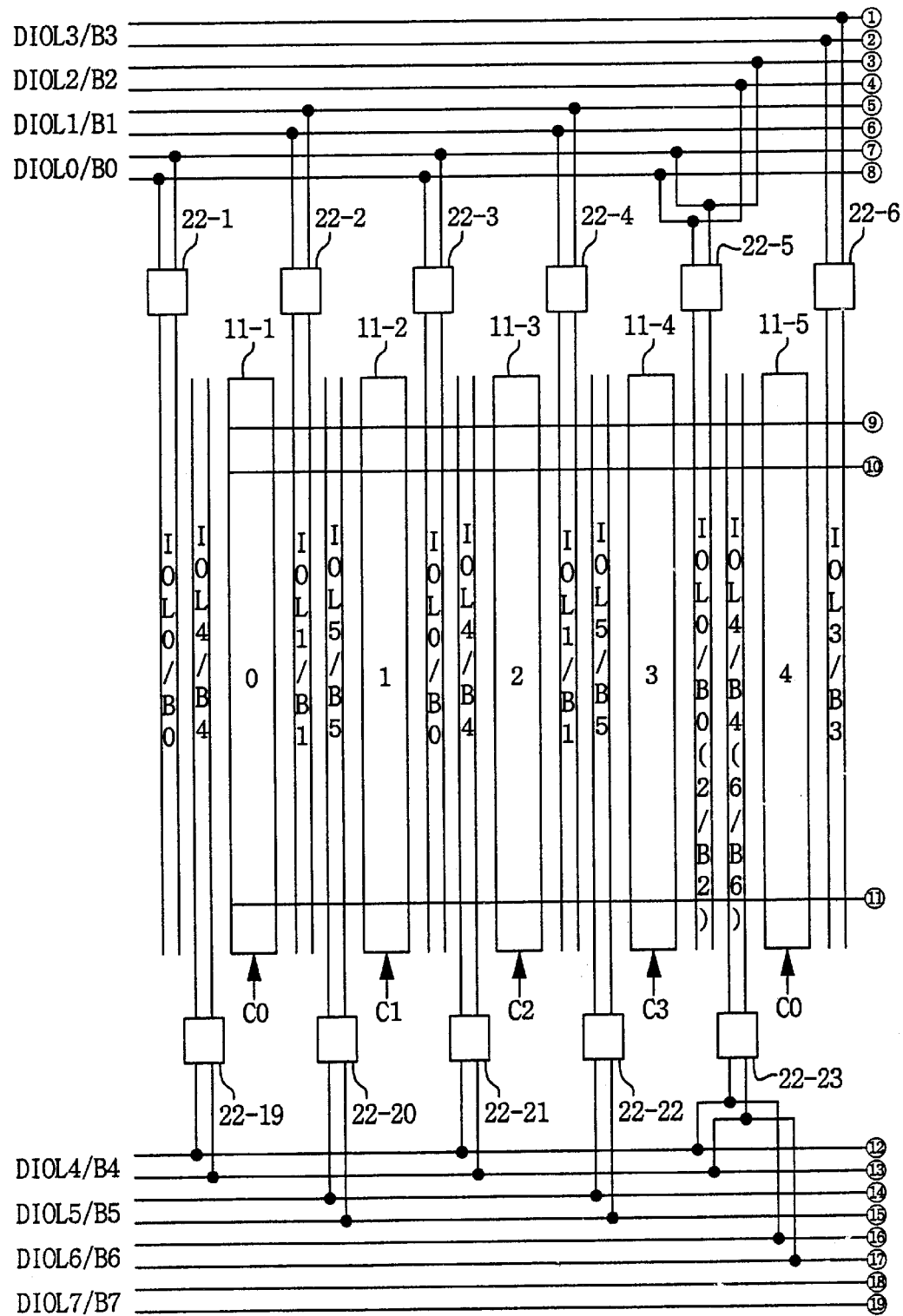
Figure 6B:
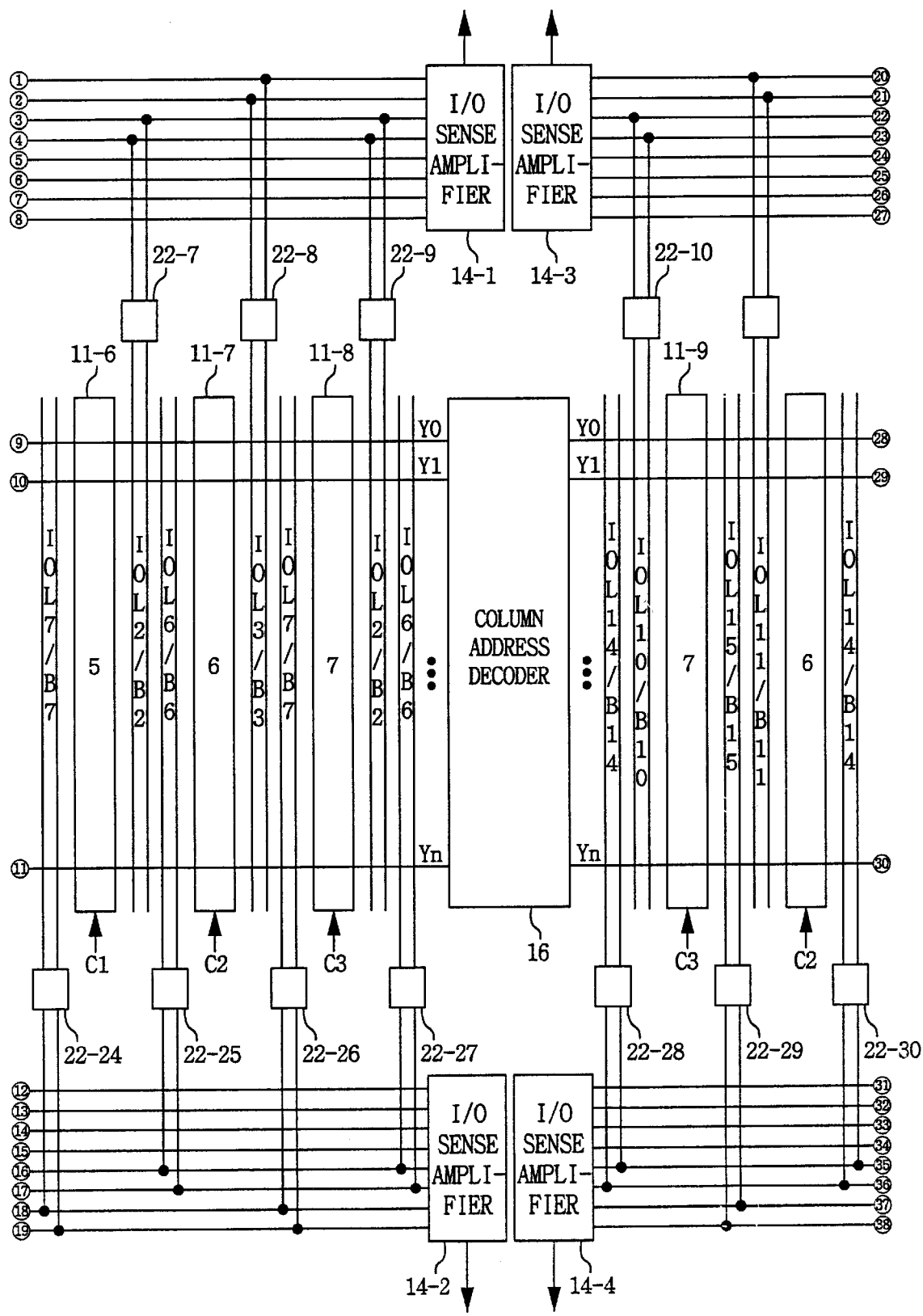
Figure 6C:
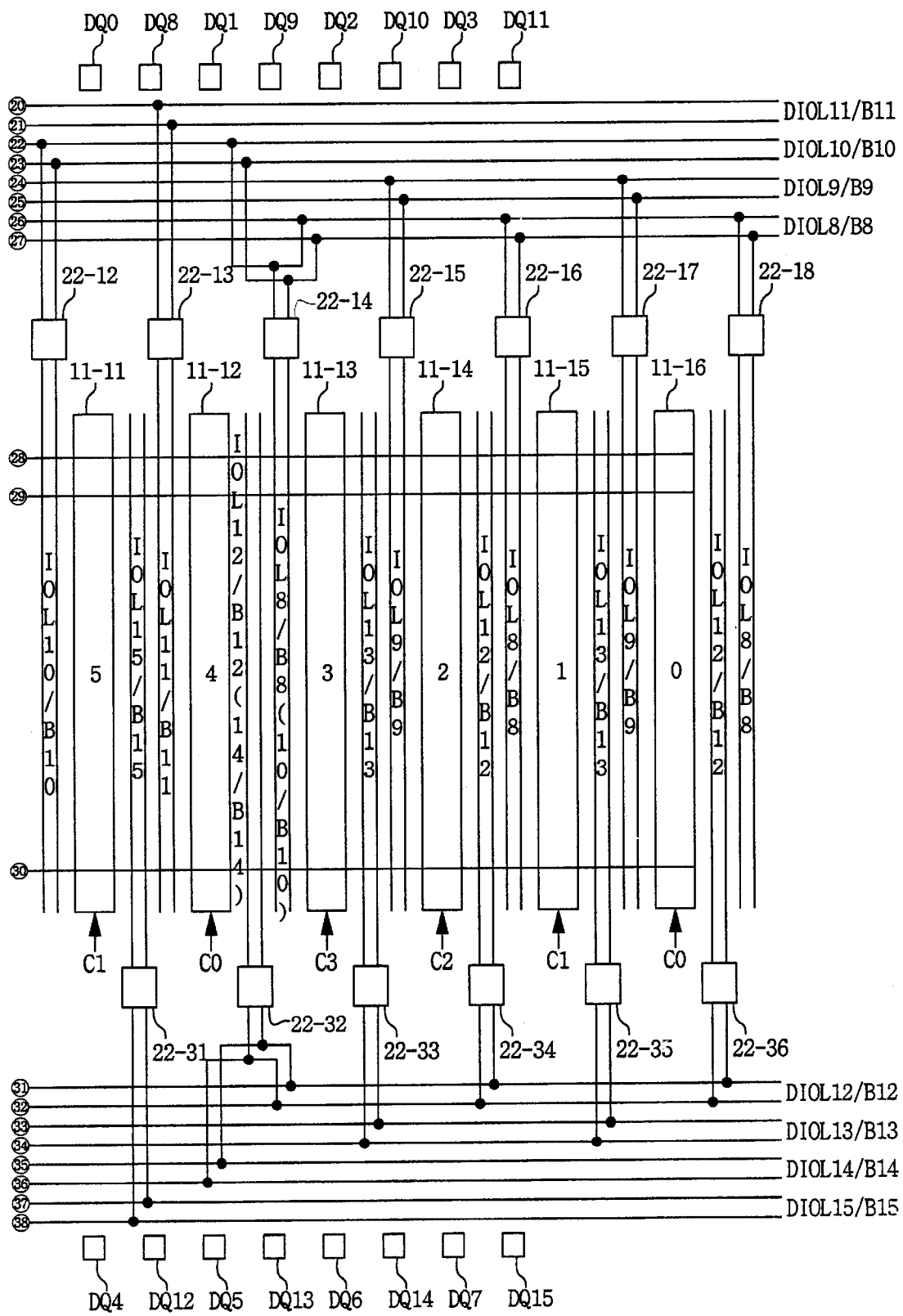

FIG. 6 is a block diagram that illustrates an arrangement of components of an integrated circuit memory according to a second embodiment of the present invention. As shown in FIG. 6, split data input/output selection circuits 22-1 through 22-18 are each connected to a single input/output line pair and are located near either the first or second end of the undivided memory cell arrays 11-1 through 11-16. In a preferred embodiment, the split data selection circuits 22-1 through 22-18 are located at the first and second ends of the undivided memory cell arrays 11-1 through 11-16 in an alternating pattern as shown in FIG. 6. In other words, the split data selection circuits are not located near the first and second ends of each of the undivided memory cell arrays 11-1 through 11-16. For example, the split data selection circuit 22-1 is located at the first end of the undivided memory cell array 11-1 which transmits/receives data bit 0 to and from the undivided memory cell array 11-1 via IOL0/B0 and IOL1/B1. The split data selection circuit 22-19 is located at the second end of the undivided memory cell array 11-1 which transmits/receives data bit 4 to and from the undivided memory cell array 11-11 via IOL4/B4 and IOL5/B5.

FIG. 7 is a schematic diagram of the split data input/output selection circuit 22-1 of FIG. 6. According to FIG. 7, the data input/output selection circuit 22-1 comprises a split write data switch 120 which includes NMOS transistors N9, N10, N11, N12 that couple the input/output line pair IOL0/B0 to a split data input driver 84 when the undivided memory cell array 11-1 is selected by the block control signal C0 during a write operation (WE) via NAND gate 80. The split data input driver 82 transmits the coupled data to the data input/output line pair DIOL0/B0.

During a read operation, a split data output driver 86 transmits the data from the data input/output line pair DIOL0/B0 to the input/output line pair IOL0/B0 via split read data switch that includes NMOS transistors N11, N12 controlled by the block control signal C0 during the read operation (RE) via NAND gate 84.

According to the present invention, locating the selection circuits at opposing ends of the memory cell array may reduce the difference in propagation time needed by different signals to travel to and from amplifiers in the integrated circuit. For example, if two signals are electrically connected to pins located on different parts of the integrated circuit, timing skew between the two signals may be reduced by locating the respective selection circuits so as to reduce the difference in respective distances traveled by the two signals.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory comprising:
   a plurality of memory cell arrays that store data in array locations; and
   a plurality of selection circuits, coupled to the plurality of memory cell arrays, wherein the plurality of selection circuits are located at first and second opposing ends of the plurality of memory cell arrays and wherein corresponding ones of the selection circuits located at first and second opposing ends provide data to the plurality of memory cell arrays for storage in the same array locations.

2. The integrated circuit memory of claim 1, wherein the plurality of selection circuits are located alternatingly at the first and the second opposing ends of the plurality of memory cell arrays.

3. The integrated circuit memory of claim 1, wherein adjacent ones of the plurality of selection circuits located at the first end of the plurality of memory cell arrays provide data to and from selected non-adjacent ones of the plurality of memory cell arrays.

4. The integrated circuit memory of claim 1 further comprising a plurality of conductive lines that conduct the data from and to the plurality of selection circuits to and from the plurality of memory cell arrays, wherein the plurality of conductive lines extend between adjacent ones of the plurality of memory cell arrays from the first end of the adjacent ones of the plurality of memory cell arrays to the second opposing end of the adjacent ones of the plurality of memory cell arrays.

5. The integrated circuit memory of claim 4, wherein the plurality of conductive lines comprises a plurality of conductive line pairs, wherein each of the plurality of selection circuits is electrically connected to a single one of the plurality of conductive line pairs.

6. The integrated circuit memory of claim 1, wherein the plurality of memory cell arrays comprise a plurality of first memory cell arrays and a plurality of second memory cell arrays, wherein the first and second pluralities of memory cell arrays are separated by a central region, wherein the plurality of selection circuits comprises:

a plurality of first selection circuits located proximate to the plurality of first memory cell arrays;

and a plurality of second selection circuits located proximate to the plurality of second memory cell arrays, the integrated circuit memory further comprising:

a column address decoder, electrically connected to the first and second pluralities of memory cell arrays, wherein the column address decoder provides column selection signals to the first and second pluralities of memory cell arrays based on a column address provided to the integrated circuit memory;

a plurality of data input/output lines, electrically connected to the plurality of selection circuits wherein the plurality of data input/output lines conduct input/output data;

a plurality of amplifiers, electrically connected to the plurality of data input/output lines, that amplify write data provided to the integrated circuit memory and amplify read data provided by the plurality of selection circuits, wherein the plurality of amplifiers are arranged around the column address decoder;

a plurality of first pins on the integrated circuit memory, used to provide at least one of the write data to and the read data from the plurality of amplifiers, wherein the plurality of first pins are located proximate to the first end of the plurality of memory cell arrays; and a plurality of second pins on the integrated circuit memory, used to provide at least one of the write data to and the read data from the plurality of amplifiers, wherein the plurality of second pins are located proximate to the second opposing end of the plurality of memory cell arrays.

7. The integrated circuit memory of claim 6, wherein selected pairs of memory cell arrays are enabled in the plurality of first and second memory cell arrays.

8. The integrated circuit memory of claim 1, wherein each of the plurality of memory cell arrays comprises:

a plurality of word lines;

a plurality of conductive line pairs;

a plurality of memory cells, electrically connected to the plurality of word lines and the plurality of conductive line pairs; and a plurality of column selection switches, electrically connected to the plurality of conductive line pairs and the plurality of word lines.

9. The integrated circuit memory of claim 8, wherein the plurality of column selection switches comprises:

a first pair of column selection switches that provide data to first conductive lines located adjacent to the memory cell array; and a second pair of column selection switches that provide data to second conductive lines located adjacent to the memory cell array.

10. An integrated circuit memory comprising a plurality of memory cell array means that store data in array locations of the plurality of memory means, wherein the data is provided to the plurality of memory means by a plurality of selection means operably associated with the plurality of memory cell array means and located at first and second opposing ends of the plurality of memory means corresponding ones of which provide data for storage in the same array locations.

11. The integrated circuit memory of claim 10, wherein the plurality of selection means are located alternatingly at the first and the second opposing ends of the plurality of memory means.

12. The integrated circuit memory of claim 10, wherein adjacent ones of the plurality of selection means located at the first end of the plurality of memory means provide data to and from selected non-adjacent ones of the plurality of memory means.

13. The integrated circuit memory of claim 10 further comprising a plurality of conductive means that conduct the data from and to the plurality of selection means to and from the plurality of memory cell means, wherein the plurality of conductive means extend between adjacent ones of the plurality of memory means from the first end of the adjacent ones of the plurality of memory means to the second opposing end of the adjacent ones of the plurality of memory means.

14. The integrated circuit memory of claim 13, wherein the plurality of conductive means comprises a plurality of conductive line pairs, wherein each of the plurality of selection means is electrically connected to a single one of the plurality of conductive line pairs.

15. The integrated circuit memory of claim 10, wherein the plurality of memory means comprise a plurality of first memory means and a plurality of second memory means, wherein the first and second pluralities of memory means are separated by a central region, wherein the plurality of selection means comprises a plurality of first selection means located proximate to the plurality of first memory means and a plurality of second selection means located proximate to the plurality of second memory means, the integrated circuit memory further comprising:

decoder means, electrically connected to the first and second pluralities of memory means, for decoding a column address provided to the integrated circuit memory to provide selection signals to the first and second pluralities of memory means;

a plurality of data input/output lines, electrically connected to the plurality of selection means, wherein the plurality of data input/output lines conduct input/output data;

a plurality of amplification means, electrically connected to the plurality of data input/output lines, for amplifying write data provided to the integrated circuit memory and amplifying read data provided by the plurality of selection means, wherein the plurality of amplification means are arranged around the decoder means;

a plurality of first pins on the integrated circuit memory, used to provide the write/read data to and from the plurality of amplification means, wherein the plurality of first pins are located proximate to the first end of the plurality of memory means; and a plurality of second pins on the integrated circuit memory, used to provide the write/read data to and from the plurality of amplification means, wherein the plurality of second pins are located proximate to the second opposing end of the plurality of memory means.

16. An integrated circuit memory comprising:

a memory cell array that stores data in array locations in the memory cell array;

a first selection circuit, coupled to the memory cell array, wherein the first selection circuit is located at a first end of the memory cell array and which provides first data to the array locations; and a second selection circuit, coupled to the memory cell array, wherein the second selection circuit is located at a second end of the memory cell array, opposite the first end, and which provides second data to the same array locations as the first selection circuit.

* * * * *